United States Patent
Cheon et al.

(10) Patent No.: US 8,816,412 B2
(45) Date of Paint: Aug. 26, 2014

(54) IMAGE SENSORS HAVING LIGHT SHIELD PATTERNS BETWEEN AN OPTICAL BLACK REGION AND AN ACTIVE PIXEL REGION

(75) Inventors: Keon Yong Cheon, Seoul (KR);
Jong-Won Choi, Seongnam-si (KR);
Sung-Hyun Yoon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 475 days.

(21) Appl. No.: 13/155,509

(22) Filed: Jun. 8, 2011

(65) Prior Publication Data
US 2011/0303956 A1 Dec. 15, 2011

(30) Foreign Application Priority Data
Jun. 14, 2010 (KR) .................. 10-2010-0056057

(51) Int. Cl.
*H01L 27/146* (2006.01)
*H01L 31/14* (2006.01)

(52) U.S. Cl.
CPC ..... *H01L 27/14603* (2013.01); *H01L 27/14623* (2013.01); *H01L 27/14609* (2013.01)
USPC ........... 257/291; 257/292; 257/225; 257/232; 257/E27.13; 257/E27.133; 438/57; 438/73; 438/81

(58) Field of Classification Search
CPC .................. H01L 27/14603; H01L 27/14609; H01L 27/14623
USPC ............... 257/21, 80, 82, 184–189, 225, 228, 257/232, 234, 253, 257, 290–294, 414, 428, 257/431–466, E31.105, E31.097, E27.122, 257/E27.127–E27.135, E27.141–E27.142, 257/231, E27.13, E27.133; 438/24, 48, 57, 438/66–67, 73, 80–81
See application file for complete search history.

(56) References Cited

U.S. PATENT DOCUMENTS

| 5,488,239 | A * | 1/1996 | Jung ............................. 257/231 |
| 6,465,859 | B1 * | 10/2002 | Fujiwara et al. .............. 257/435 |
| 6,946,638 | B2 * | 9/2005 | Kuwazawa et al. ........ 250/208.1 |
| 7,675,101 | B2 * | 3/2010 | Hwang ......................... 257/292 |
| 7,683,451 | B2 * | 3/2010 | Shin ............................. 257/435 |
| 7,851,879 | B2 * | 12/2010 | Inoue ........................... 257/435 |
| 7,943,455 | B2 * | 5/2011 | Kim ............................. 438/199 |
| 8,445,827 | B2 * | 5/2013 | Mizuta et al. .............. 250/208.1 |
| 2002/0149718 | A1 * | 10/2002 | Melnik et al. ................ 349/110 |
| 2004/0132262 | A1 | 7/2004 | Ayabe et al. |
| 2008/0105908 | A1 * | 5/2008 | Lee .............................. 257/290 |
| 2008/0142919 | A1 * | 6/2008 | Shin ............................. 257/435 |

(Continued)

FOREIGN PATENT DOCUMENTS

| JP | 2004-104203 | 4/2004 |
| JP | 2009-099626 | 5/2009 |
| KR | 1020040022169 A | 3/2004 |
| KR | 100827445 B1 | 4/2008 |

*Primary Examiner* — Laura Menz
*Assistant Examiner* — Maliheh Malek
(74) *Attorney, Agent, or Firm* — Volentine & Whitt, PLLC

(57) ABSTRACT

An image sensor having a light receiving region and an optical black region includes a semiconductor substrate, an interconnection disposed on the semiconductor substrate and extending along an interface between the light receiving region and the optical black region, and via plugs disposed between the interconnection and the semiconductor substrate and serving as light shielding members at the interface. The via plugs are arranged in a zigzagging pattern along the interface.

19 Claims, 5 Drawing Sheets

(56) References Cited

U.S. PATENT DOCUMENTS

| | | | |
|---|---|---|---|
| 2008/0239124 A1* | 10/2008 | Mori et al. | 348/308 |
| 2009/0032853 A1* | 2/2009 | Kim | 257/292 |
| 2010/0288911 A1* | 11/2010 | Mizuta et al. | 250/208.1 |
| 2011/0019038 A1* | 1/2011 | Okuno | 348/246 |
| 2011/0279720 A1* | 11/2011 | Nakagawa et al. | 348/300 |
| 2012/0119287 A1* | 5/2012 | Park et al. | 257/329 |
| 2012/0138775 A1* | 6/2012 | Cheon et al. | 250/208.1 |
| 2013/0050552 A1* | 2/2013 | Oishi | 348/301 |
| 2013/0200478 A1* | 8/2013 | Toyoda | 257/432 |
| 2013/0241019 A1* | 9/2013 | Mizuta et al. | 257/432 |

\* cited by examiner

IMAGE SENSORS HAVING LIGHT SHIELD PATTERNS BETWEEN AN OPTICAL BLACK REGION AND AN ACTIVE PIXEL REGION

CROSS-REFERENCE TO RELATED APPLICATION

A claim of priority under 35 U.S.C. §119 is made to Korean Patent Application No. 10-2010-0056057, filed on Jun. 14, 2010.

BACKGROUND

The inventive concept relates to image sensors. More particularly, the inventive concept relates to image sensors having a pixel array region and a peripheral circuit region containing circuitry for driving the pixels of the active pixel region.

Image sensors are devices which convert optical images into electrical signals. Such image sensors are widely used in digital cameras, camcorders and other optical devices. An image sensor includes a pixel array region in which pixels are arrayed in two dimensions and a peripheral circuit region containing circuitry for driving the pixels. The pixel array region may include a core of main pixels and dummy pixels. In general, the dummy pixels are disposed along the periphery of the core of main pixels and provide a reference signal corresponding to optical black.

SUMMARY

According to one aspect of the inventive concept there is provided an image sensor having a light receiving region and an optical black region bordering the light receiving region, and including a semiconductor substrate, an interconnection disposed on the semiconductor substrate and extending longitudinally along the interface between the optical black region and the light receiving region, and via plugs arranged so as to serve as light shielding members at the interface.

The via plugs include first and second groups of via plugs interposed between the interconnection and the semiconductor substrate. The first group of via plugs is disposed to one side of and adjacent the interface. The second group of via plugs is disposed on the other side of and adjacent the interface. The via plugs of the first group are spaced from one another in the lengthwise direction of the interconnection, and the via plugs of the second group are also spaced from one another in the lengthwise direction of the interconnection. However, the first and second groups of via plugs are offset from one another in the lengthwise direction.

According to another aspect of the inventive concept there is provided an image sensor having a light receiving region and an optical black region, and including a semiconductor substrate, a set of two interconnections disposed on the semiconductor substrate and each extending longitudinally along the interface between the light receiving region and the optical black region, via plugs interposed between the set of interconnections and the substrate and arranged to serve as light shielding members at the interface, at least one signal line extending between the interconnections from the light receiving region toward the optical black region, and dummy signal patterns extending from the at least one signal line.

The interconnections are spaced horizontally from each other along the interface, and each of the interconnections has a first sidewall facing the light receiving region and a second sidewall facing the optical black region. The via plugs are arranged in first and second groups. The via plugs of the first group are spaced from one another in the lengthwise directions of the interconnections. The via plugs of the second group are also spaced from one another in the lengthwise directions of the interconnections. The at least one signal line is disposed at the same level as the interconnections. The dummy signal patterns are each disposed parallel to a surface of the semiconductor substrate. The dummy patterns extend in opposite directions from opposite sides of said at least one signal line, respectively, and each of the dummy signal patterns is disposed adjacent one of the first and second sidewalls of the interconnections.

According to another aspect of the inventive concept there is provided an image sensor including a substrate, active pixels occupying a main pixel array region, and dummy pixels occupying a dummy pixel region located along the periphery of the main pixel region, peripheral circuitry comprising MOS transistors occupying a peripheral circuit region, signal lines electrically connecting the peripheral circuitry to the active pixels, at least one interconnection disposed on the substrate between the active pixels and the dummy pixels, and at least one set of opaque light shielding members interposed between the interconnection and the semiconductor substrate.

Each of the active pixels includes a photo device activated by light incident thereon such that the main pixel region constitutes a light receiving region of the image sensor. The dummy pixels generate a signal corresponding to optical black. The dummy pixel region and the peripheral circuit region together constitute an optical black region of the image sensor, and the light receiving region and the optical black region have an interface a length of which extends across the substrate in the direction of a first axis. The at least one interconnection extends along this interface between the light receiving region and the optical black region. The light shielding members of each set are disposed at the same level in the sensor and adjacent the interface, and the light shielding members of each set are arranged in a zigzagging pattern along the length of the interface.

BRIEF DESCRIPTION OF THE DRAWINGS

These and other features and aspects of the inventive concept will be better understood from the following detailed description of preferred embodiments of the inventive concept made with reference to the accompanying drawings. In the drawings.

DETAILED DESCRIPTION OF THE EMBODIMENTS

Figure 1:
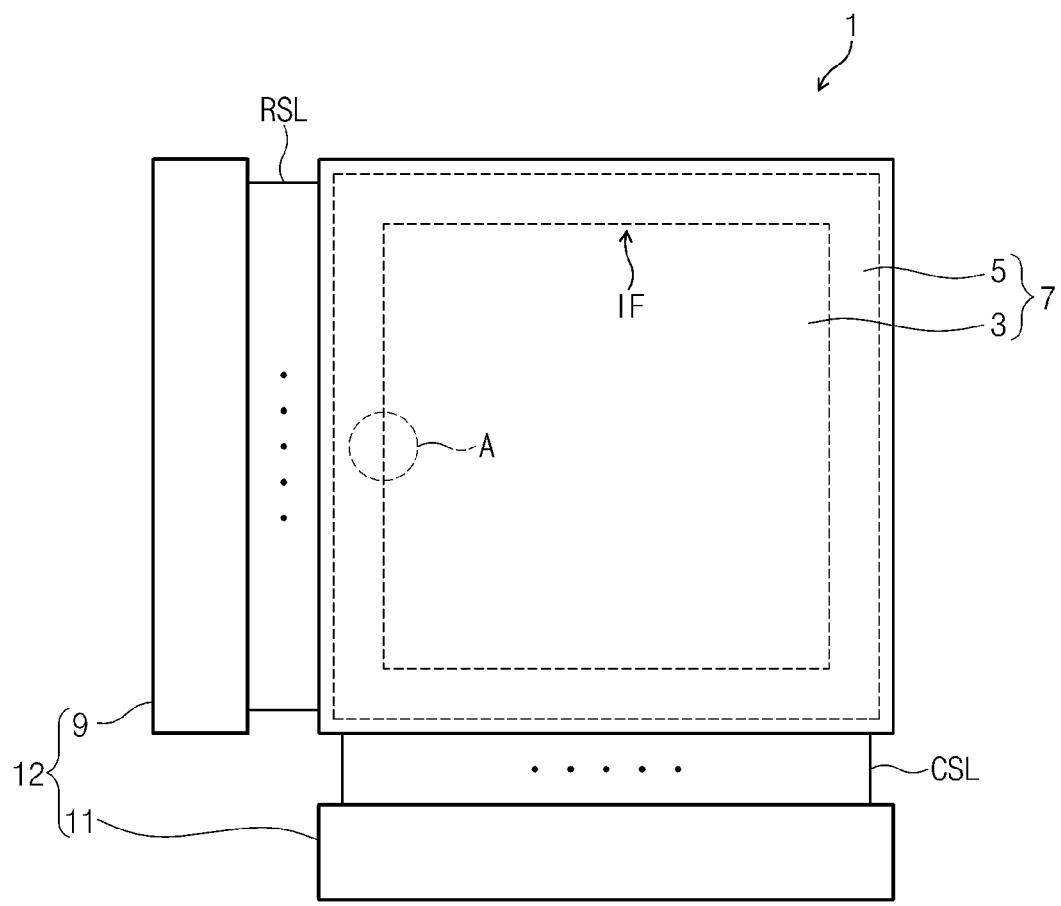
FIG. 1 is a schematic block diagram of an embodiment of an image sensor according to the inventive concept.

Various embodiments and examples of embodiments of the inventive concept will be described more fully hereinafter with reference to the accompanying drawings. In the drawings, the sizes and relative sizes and shapes of elements, layers and regions may be exaggerated for clarity. In particular, the illustrations of the image sensor and regions thereof are schematic. Also, like numerals are used to designate like elements throughout the drawings.

Furthermore, spatially relative terms, such as "top" and "bottom" are used to describe an element's relationship to another as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element (or layer) is referred to as being disposed "on" another element, it can be directly on the other element or intervening elements may be present. In contrast, when an element is referred to as being "directly on" or "directly connected to" another element, there are no intervening elements present. Similarly, when an element is referred to as being "interposed" between two other elements, it can extend from one of the elements to the other or intervening elements may be present.

A first embodiment of an image sensor according to the inventive concept will be described hereinafter with reference to FIGS. 1-4.

Referring first to FIG. 1, the image sensor 1 has a pixel array region 7 and a peripheral circuit region 12. The peripheral circuit region contains circuitry that drives pixels in the pixel array region 7. The pixel array region 7 includes a main or active pixel region 3 and a dummy pixel region 5 surrounding the main pixel region 3. The peripheral circuit region 12 includes a row control logic 9 and a column control logic 11. The row control logic 9 may include a row decoder, and the column control logic 11 may include a column decoder.

Electrical signals generated by the row control logic 9 are transmitted to the pixels in the pixel array region 7 through row signal lines RSL, and electrical signals generated by the column control logic 11 are transmitted to the pixels in the pixel array region 7 through a column signal lines CSL.

The main pixel region 3 has main pixels which are irradiated with light reflected from an external object. The dummy pixel region 5 has dummy pixels which generate a reference signal corresponding to optical black. Any external light incident on the dummy pixel region 5 would cause the reference signal to become unstable, and would thereby degrade the performance of the image sensor. Thus, light should be prevented from being incident on the dummy pixel region 5.

The peripheral circuit region 12 may include a plurality of MOS transistors. In this case, each of the MOS transistors includes a gate insulating layer on a semiconductor substrate, e.g., a silicon substrate. The gate insulating layer is generally formed by thermally oxidizing the silicon substrate. As a result, dangling bonds can be generated at an interface between the silicon substrate and the gate insulating layer. Such dangling bonds, if left unaccounted for, would adversely impact the electrical characteristics and reliability of the MOS transistors. Thus, a hydrogen thermal treatment can be performed in a back-end process, i.e., subsequent to the fabrication of the components of the MOS transistors, to remove the dangling bonds.

MOS transistors in the peripheral circuit region 12 may also exhibit unstable characteristics when irradiated with external light. In other words, the performance of the image sensor can be reduced if light from outside the image sensor is introduced onto the peripheral circuit region 12. Accordingly, light should also be prevented from being incident on the peripheral circuit region 12. In the specification, the peripheral circuit region 12 and the dummy pixel region 5 will be referred as an optical black region, and the main pixel region 3 will be referred as a light receiving region. That is, in the image sensor 1, all the regions except the main pixel region 3 may constitute the optical black region. For convenience, reference numeral 3 will be used hereafter to designate the light receiving region and reference numeral 5 will be used to designate the optical black region.

Figure 2:
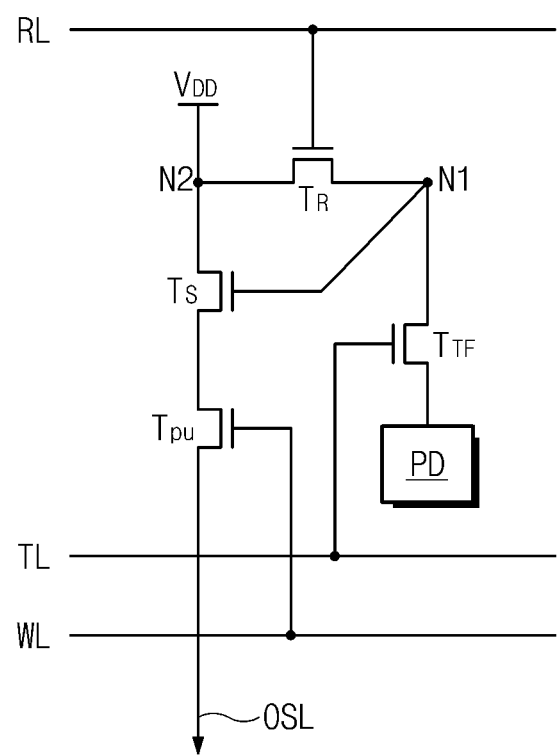
FIG. 2 is an equivalent circuit diagram of a unit pixel of the image sensor shown in FIG. 1.

An example of an equivalent circuit of a unit pixel of the pixel array region 7 of will now be described with reference to FIG. 2.

The unit pixel includes a photo device PD and at least one switching device connected to the photo device PD. In this example, the photo device PD is a photo diode including an n-type impurity region and a p-type impurity region where holes and electrons are respectively generated when the photo diode is irradiated. The at least one switching device includes a transfer transistor $T_{TF}$, a reset transistor $T_R$, a sensing transistor $T_S$ and a pull-up transistor $T_{PU}$ which are serially connected to the photo diode PD. A first node N1 between the transfer transistor $T_{TF}$ and the reset transistor $T_R$ is connected to a gate electrode of the sensing transistor $T_S$. A second node N2 between the reset transistor $T_R$ and the sensing transistor $T_S$ is connected to a power supply $V_{DD}$. Also, in this example in which the photo device PD includes a p-type impurity region and an n-type impurity region, the transfer transistor $T_{TF}$, the reset transistor $T_R$, the sensing transistor $T_S$ and the pull-up transistor $T_{PU}$ may be NMOS transistors. In this case, the transfer transistor $T_{TF}$ is connected to the n-type impurity region of the photo diode. That is, the n-type impurity region of the photo diode corresponds to a source region of the transfer NMOS transistor $T_{TF}$.

Gate electrodes of the reset transistor TR, the transfer transistor $T_{TF}$ and the pull-up transistor $T_{PU}$ are electrically connected to a reset line RL, a transfer line TL and a word line WL, respectively. A drain region of the pull-up transistor $T_{PU}$ is electrically connected to an output signal line OSL. The reset line RL, the transfer line TL and the word line WL extend parallel to each other and are connected to the row control logic 9 of the image sensor, and the output signal line OSL extends across the reset line RL, the transfer line TL and the word line WL and is connected to the column control logic 11. Thus, the row signal lines RSL of the image sensor, in this example, include the reset line RL, the transfer line TL and the word line WL, and the column signal lines CSL include the output signal line OSL.

According to one aspect of the inventive concept, opaque patterns, namely, light shielding members or patterns, are arranged along an interface IF between the light receiving region 3 and the optical black region 5 in such a pattern that they prevent light incident on the light receiving region 3 from propagating to the optical black region 5.

A region 'A' of the image sensor 1 shown in FIG. 1, which includes a section of the interface IF provided with the light shielding patterns, will now be described with reference to FIGS. 3 and 4.

In this region 'A', a first interconnection M1, namely, a lower interconnection, is disposed on a semiconductor substrate 2. The lower interconnection M1 extends along the interface IF between the light receiving region 3 and the optical black region 5 of the image sensor 1. The lower interconnection M1 has a first sidewall SW1 which faces the light receiving region 3 and a second sidewall SW2 which faces the optical black region 5. The lower interconnection M1 may be a metal line.

First via plugs extend between the lower interconnection M1 and the semiconductor substrate 2. The first via plugs include a first group of via plugs VP1' adjacent one side of the interface IF and a second group of via plugs VP1" adjacent the other side of the interface IF, such that the first and second groups of via plugs VP1' and VP1" are spaced from one another in the widthwise direction of the lower interconnection M1 (direction of the X-axis in FIG. 3). Thus, the first group of via plugs VP1' is disposed closer to one of the sidewalls of the lower interconnection M1 than the second group of via plugs VP1" and likewise, the second group of via plugs VP1" is disposed closer to the other of the sidewalls of the lower interconnection M1 than the first group of via plugs VP1'. More specifically, for example, the first group of via plugs VP1' is disposed adjacent to the first sidewall SW1, and the second group of via plugs VP1" is disposed adjacent to the second sidewall SW2. Furthermore, in the illustrated example, the via plugs VP1' of the first group are aligned in the lengthwise direction of the lower interconnection M1 (direction of the Y-axis in FIG. 3) and likewise, the via plugs VP1" of the second group are aligned in the lengthwise direction of the lower interconnection M1.

Also, the first group of via plugs VP1' and the second group of via plugs VP1" are offset from one another in the lengthwise direction of the lower interconnection M1. In this respect, the lengthwise direction of the lower interconnection M1 (Y-axis direction) corresponds to direction along which the interface IF extends across the substrate 2.

Looked at another way, the via plugs VP1' of the first group are arrayed in (spaced from one another along) the lengthwise direction (Y-axis) of the lower interconnection M1, the via plugs VP1" of the second group are also arrayed in (spaced from one another along) the lengthwise direction of the lower interconnection M1, and the via plugs VP1" of the second group are each located at a position offset in the widthwise direction (e.g., toward the second sidewall SW2) from a region between two adjacent ones of the via plugs VP' of the first group. In the illustrated example, the center of each respective one of the via plugs VP1' of the first group is located, with respect to the direction of the Y-axis, midway between the centers of two of the vias of the second group VP1" which are closest to one another in the direction of the Y-axis, and vice versa.

Figure 3:
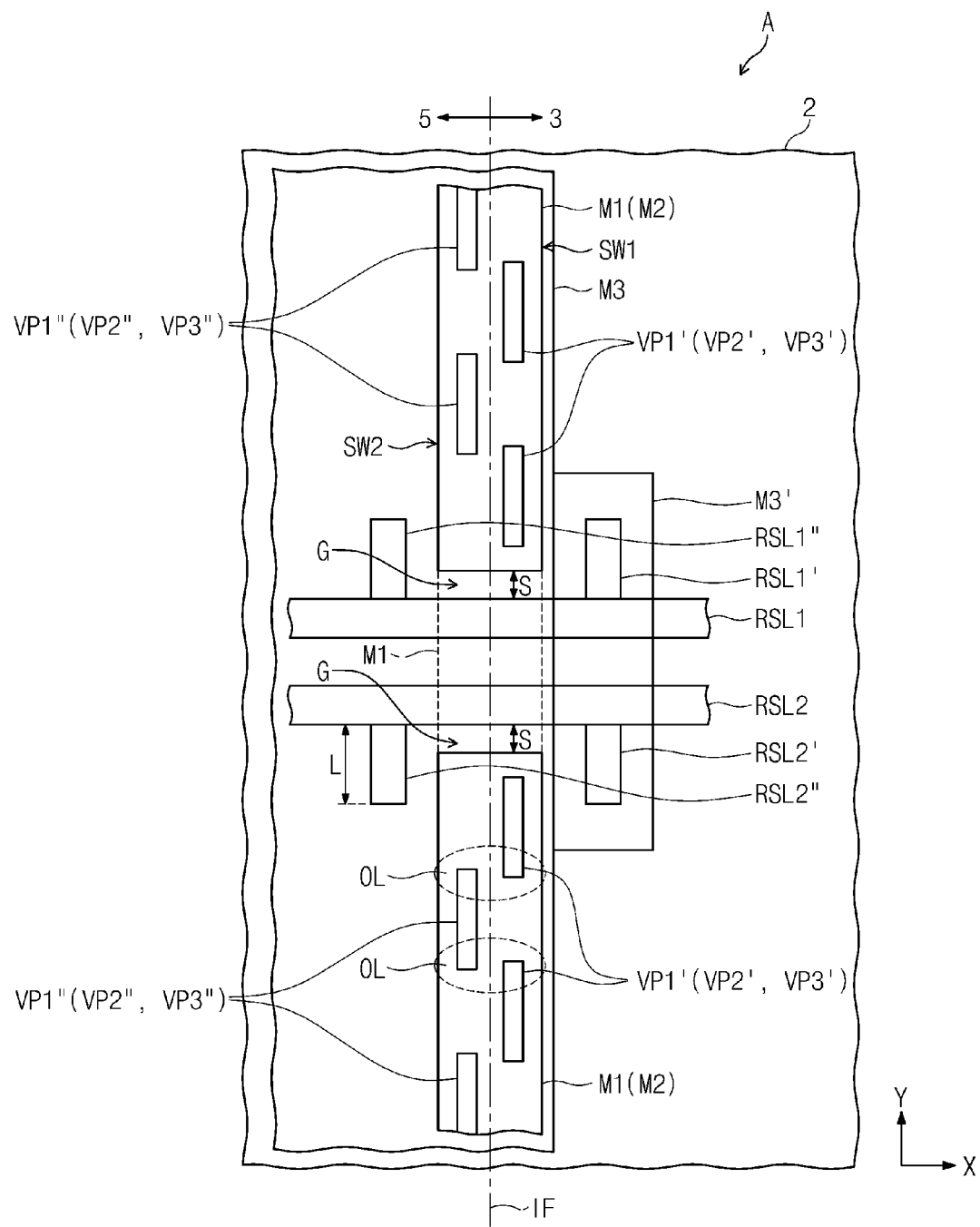
FIG. 3 is an enlarged plan view of the region 'A' of the image sensor shown in FIG. 1.

Accordingly, the first via plugs VP1' and VP1" are disposed in a zigzag arrangement, crossing back and forth over the interface IF, as best shown in FIG. 3. The zigzag arrangement can be seen by connecting the center of each of the via plugs VP1' and VP1" with the center of the via plug closest thereto in the direction of the Y-axis.

In the illustrated embodiment of the inventive concept, the first via plugs VP1' and VP1" are bar-shaped metal plugs each elongated in a direction parallel to the lengthwise direction of the interconnection, i.e., each having a major axis parallel with the Y-axis. In this case, the center of each via plug is located at the center of the major axis. Furthermore, ends of the via plugs VP1' of the first group are juxtaposed with ends of the via plugs VP1" of the second group, respectively, in the direction of the X-axis. Furthermore, top surfaces of the first via plugs VP1' and VP1" contact a bottom surface of the lower interconnection M1, and bottom surfaces of the first via plugs VP1' and VP1" contact a surface of the semiconductor substrate 2 such as a surface of a device isolation layer. Thus, light propagating between the lower interconnection M1 and the semiconductor substrate 2, at least in the direction of the X-axis, from the light receiving region 3 toward the optical black region 5 is completely blocked by the first via plugs VP1' and VP1".

Also, in the illustrated example of this embodiment, second interconnections M2, namely, intermediate interconnections, are disposed on the lower interconnection M1. The second interconnections M2 are spaced from one another along the lengthwise direction of the lower interconnection M1. Thus, the intermediate interconnections M2 are also arrayed along the interface IF between the light receiving region 3 and the optical black region 5. Each of the intermediate interconnections M2 also has a first sidewall SW1 that faces the light receiving region 3 and a second sidewall SW2 that faces the optical black region 5. The intermediate interconnections M2 may be metal lines, respectively, each extending longitudinally like the lower interconnection M1, along the interface IF.

Second via plugs are disposed between the intermediate interconnections M2 and the lower interconnection M1. The second via plugs may be metal plugs arranged similarly to the first via plugs VP1' and VP1". That is, the second via plugs may also include a first group of via plugs VP2' adjacent one side of the interface IF and a second group of via plugs VP2" adjacent the other side of the interface IF. More specifically, the first group of via plugs VP2' is disposed adjacent to the first sidewalls SW1 of the intermediate interconnections M2 and the second group of via plugs VP2" is disposed adjacent to the second sidewalls SW2 of the intermediate interconnections M2. Furthermore, the first and second groups of via plugs VP2' and VP2" are offset relative to each other along the length of the interface IF, i.e., in the lengthwise direction of the intermediate interconnections M2. In this example, as well, top surfaces of the second via plugs VP2' and VP2" each contact the bottom surface of an intermediate interconnection M2, and bottom surfaces of the second via plugs VP2' and VP2" contact the top surface of the lower interconnection M1.

At least one signal line extends between adjacent ones of the intermediate interconnections M2. For example, as shown in FIGS. 3 and 4, first and a second row signal lines RSL1 and RSL2 extend in the direction of the X-axis between adjacent ones of the intermediate interconnections M2. The first and second row signal lines RSL1 and RSL2 may be coplanar with the intermediate interconnections M2 and hence, disposed at the same level as the intermediate interconnections M2. In the embodiment of the inventive concept described so far, each of the first and second row signal lines RSL1 and RSL2 corresponds to a reset line RL, a transfer line TL or a word line WL.

The first and second row signal lines RSL1 and RSL2 thus may be connected with active and dummy pixels in the pixel array region 7. In addition, the first and second row signal lines RSL1 and RSL2 may be connected with the row control logic 9 in the optical black region.

In this case, the row signal lines RSL1 and RSL2 are electrically insulated from the intermediate interconnections M2. To this end, the row signal lines RSL1 and RSL2 are spaced apart from the adjacent intermediate interconnections M2 by predetermined distances S, respectively. That is, a gap G is present between each signal line RSL1 and RSL2 and the closest intermediate interconnection M2. Insulating material, i.e., one or more insulating layers, fills the space between the semiconductor substrate 2 and the intermediate interconnections M2, including the gaps G2. However, such insulating material is not necessarily opaque with respect to light introduced the light receiving region 3.

According to an aspect of the inventive concept, at least one opaque pattern is disposed adjacent to each gap G to prevent light, incident on the light receiving region 3, from being introduced to the optical black region 5 through the gaps G.

In an example of this embodiment, the at least one opaque pattern comprises first and second dummy signal patterns on opposite sides of each gap G. For example, the dummy signal patterns include first and second dummy signal patterns RSL1' and RSL1" extending from one side of the first row signal line RSL1, and first and second dummy signal patterns RSL2' and RSL2" extending from one side of the second row signal line RSL2. The first dummy signal patterns RSL1' and RSL2' are disposed in the light receiving region 3, and the second dummy signal patterns RSL1" and RSL2" are disposed in the optical black region 5.

Furthermore, the dummy signal patterns RSL1', RSL1", RSL2' and RSL2" may each be a metal line extending longitudinally in the direction of the Y-axis. In this case, each of the dummy signal patterns RSL1', RSL1", RSL2' and RSL2" may have a length L which is equal to or greater than the predetermined distances S corresponding to the widths of the gaps G.

This aspect of the inventive concept, though, is not limited to any particular number of dummy signal patterns. For example, only one respective dummy signal pattern may extend from the first row signal line RSL1 and likewise, only one respective dummy signal pattern may extend from the second row signal line RSL2.

Figure 5:
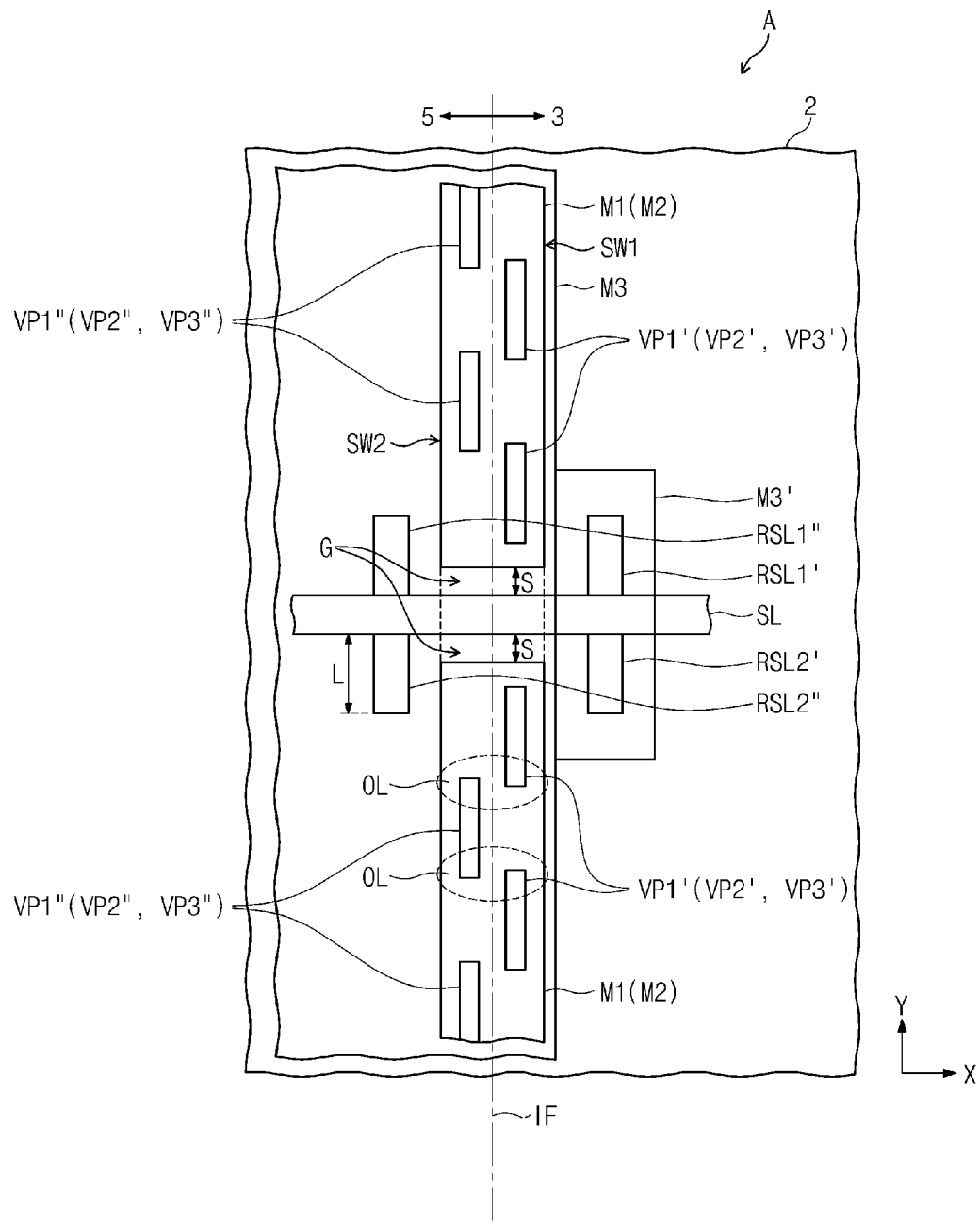
FIG. 5 is an enlarged plan view of a region, corresponding to the region 'A' in FIG. 1, of another embodiment of an image sensor according to the inventive concept.

In another embodiment of an image sensor according to the inventive concept, only one signal line SL extends between adjacent ones of the intermediate interconnections M2 as shown in FIG. 5. The single signal line SL may correspond to any one of the reset line RL, the transfer line TL and the word line WL illustrated in FIG. 2. Alternatively, the single signal line SL may correspond to the output signal line OSL illustrated in FIG. 2.

In any case, in the illustrated example of this embodiment, first dummy signal patterns RSL1' and RSL2' extend in the light receiving region 3 from opposite sides of the single signal line SL, respectively, and second dummy signal line RSL1" and RSL2" extend in the optical black region 5 also from opposite sides of the single signal line SL, respectively. Alternatively, only one dummy signal pattern may extend from each sidewall of the single signal line SL.

The dummy signal patterns RSL1' and/or RSL1", and RSL2' and/or RSL2" may be formed of the same material as the row signal lines RSL1 and RSL2 or the single signal line SL. For example, the row signal lines RSL1 and RSL2 or the single signal line SL may be metal lines, and the dummy signal patterns RSL1', RSL1", RSL2' and RSL2" may also be metal patterns.

Figure 4:
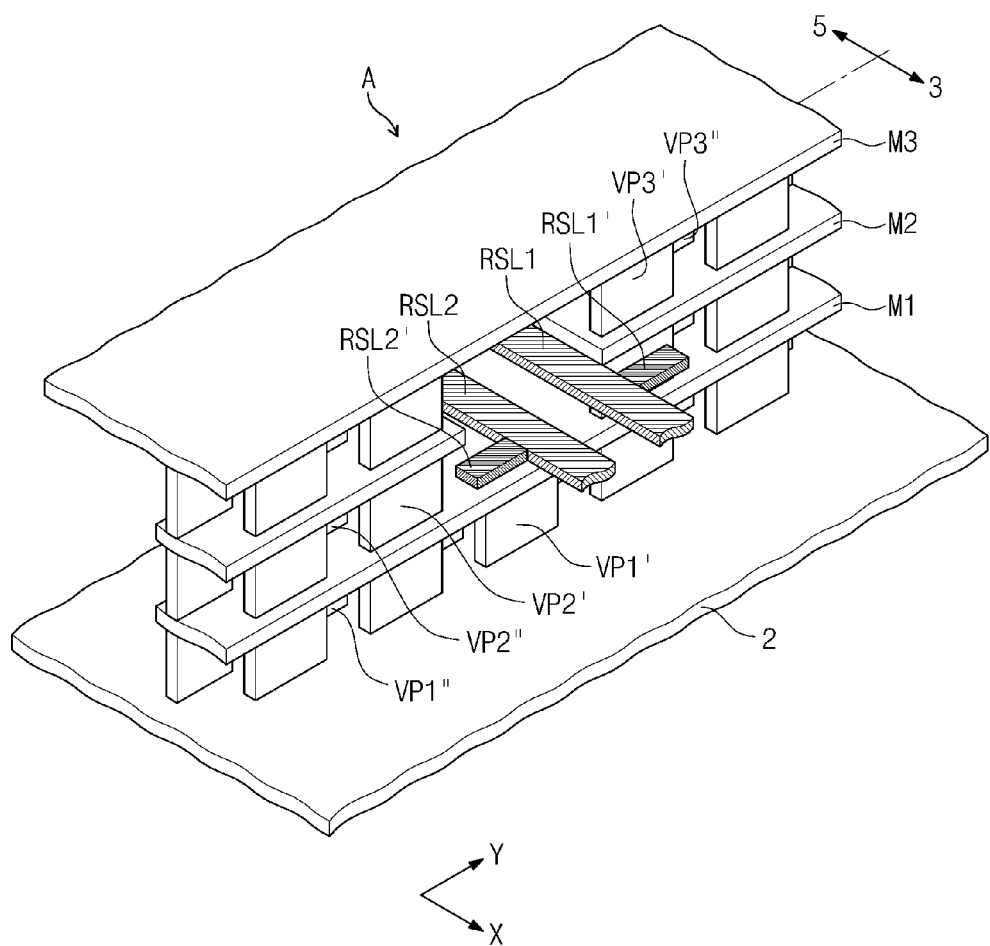
FIG. 4 is an enlarged perspective view of the region 'A' of the image sensor shown in FIG. 1.

Referring now to FIGS. 3, 4 and 5, a third interconnection M3, namely, an upper interconnection, may be disposed on the intermediate interconnections M2 as extending longitudinally in the direction of the Y-axis. That is, in this case, the upper interconnection M3 extends along the interface IF between the light receiving region 3 and the optical black region 5 and has a first sidewall SW1 that faces the light receiving region 3 and a second sidewall SW2 that faces the optical black region 5. The upper interconnection M3 may be a metal line.

Furthermore, in this example, third via plugs are disposed between the upper interconnection M3 and the intermediate interconnections M2. The third via plugs may include metal plugs which are arranged similarly to the first and second via plugs VP1', VP1", VP2' and VP2". That is, the third via plugs may also include a first group of via plugs VP3' adjacent one side of the interface IF and a second group of via plugs VP3" adjacent the other side of the interface IF, and wherein the first and second groups of via plugs VP3' and VP3" are offset from each other along the length of the interface IF. Furthermore, top surfaces of the third via plugs VP3' and VP3" contact the bottom surface of the upper interconnection M3, and bottom surfaces of the third via plugs VP3' and VP3" contact the top surfaces of the intermediate interconnections M2.

Furthermore, the upper interconnection M3 may extend to cover the optical black region 5. That is, the upper interconnection M3 may prevent light from irradiating the optical black region 5.

In another example of the embodiment of FIG. 5, a sub-pattern M3' is provided to cover the dummy signal patterns RSL1' and RSL2' which are disposed in the light receiving region 3. The sub-pattern M3' preferably extends from a sidewall of the upper interconnection M3.

As described above, at least one set of opaque light shielding members is disposed between an interconnection and the semiconductor substrate. The light shielding members of each set are disposed in groups at the same level in the sensor. The light shielding members in each of the groups are spaced from one another and aligned in the direction of a first axis coinciding with the direction along which the interface extends across the substrate. Furthermore, the groups of light shielding members are spaced from one another in the direction of a second axis perpendicular to the first axis. Finally, in each set of light shielding members, respective ones of the light shielding members have opposite ends that are juxtaposed in the direction of the second axis with two other light shielding members, respectively, of the arrangement. Thus, the light shielding members of each arrangement block light at that particular level in the sensor from propagating from the light receiving region to the optical black region. Each set of light shielding members is thus arranged in a zigzag and may be embodied as via plugs disposed along the interface IF between the light receiving region 3 and the optical black region 5.

Thus, it is possible to maximize the blocking of light from the light receiving region 3 towards the optical black region 5. Moreover, because the light shielding members are spaced apart from each other, hydrogen atoms may be readily supplied into the optical black region 5 through regions between the light shielding members during a process for improving characteristics of MOS transistors formed in the optical black region 5. That is, the light shielding members may significantly improve a light shielding effect without impeding a hydrogen passivation process.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. An image sensor having a light receiving region, and an optical black region bordering the light receiving region, and comprising:
    a semiconductor substrate;
    an interconnection disposed on the semiconductor substrate and comprising a line of electrically conductive material extending lengthwise along the interface between the optical black region and the light receiving region;
    a first group of via plugs interposed between the line of electrically conductive material and the semiconductor substrate, the via plugs of the first group spaced from one another in the lengthwise direction of the line of electrically conductive material such that first gaps are defined between the via plugs of the first group in the lengthwise direction; and a second group of via plugs interposed between the line of electrically conductive material and the semiconductor substrate, the via plugs of the second group spaced from one another in the lengthwise direction of the line of electrically conductive material such that second gaps are defined between the via plugs of the second group in the lengthwise direction, and wherein the first group of the via plugs is disposed to one side of and adjacent the interface, the second group of via plugs is disposed on the other side of and adjacent the interface, and the first group of via plugs is offset in the lengthwise direction from the second group of via plugs such that the first gaps between the via plugs of the first group are aligned with the via plugs of the second group, respectively, in a widthwise direction of the line perpendicular to the lengthwise direction, and such that the second gaps between the via plugs of the second group are aligned with the via plugs of the first group, respectively, in the widthwise direction.

2. The image sensor of claim 1, wherein each of the via plugs comprises a bar-shaped light shielding member elongated in a direction parallel to the lengthwise direction of the line of electrically conductive material.

3. The image sensor of claim 2, wherein ends of the via plugs of the first group are juxtaposed with ends of the via plugs of the second group, respectively, in the widthwise direction of the line of electrically conductive material.

4. The image sensor of claim 1, wherein the light receiving region is a core portion of a pixel array region containing an array of pixels, and the optical black region comprises an outer peripheral portion of the pixel array region.

5. An image sensor having a light receiving region and an optical black region, and comprising:
a semiconductor substrate;
a set of two interconnections disposed on the semiconductor substrate and each extending longitudinally along an interface between the light receiving region and the optical black region, the interconnections being spaced horizontally from each other along the interface, and each of the interconnections having a first sidewall facing the light receiving region and a second sidewall facing the optical black region;
a first group of via plugs interposed between the set of interconnections and the semiconductor substrate, the via plugs of the first group being spaced from one another in the lengthwise directions of the interconnections;
a second group of via plugs interposed between the set of interconnections and the semiconductor substrate, the via plugs of the second group being spaced from one another in the lengthwise directions of the interconnections;
at least one signal line disposed at the same level as the interconnections, each said signal line extending between the interconnections from the light receiving region toward the optical black region; and
dummy signal patterns each disposed parallel to a surface of the semiconductor substrate, the dummy signal patterns extending in opposite directions from opposite sides of said at least one signal line, respectively, and each of the dummy signal patterns disposed adjacent one of the first and second sidewalls of the interconnections.

6. The image sensor of claim 5, wherein the first and second groups of the via plugs are spaced from one another in a widthwise direction, of said two interconnections, perpendicular to the lengthwise directions, and the first group of via plugs is offset in the lengthwise directions of the interconnections from the second group of via plugs.

7. The image sensor of claim 5, wherein each of the dummy signal patterns has a length equal to or greater than a distance between one of the interconnections and said at least one signal line.

8. The image sensor of claim 5, wherein the interconnections, the at least one signal line and the dummy signal patterns are constituted by a metal layer.

9. The image sensor of claim 5, further comprising:
an upper interconnection disposed on said set of two interconnections, the upper interconnection crossing over the signal line between said two interconnections;
a first group of upper via plugs interposed between the upper interconnection and said set of two interconnections, the upper via plugs of the first group being spaced from one another in the lengthwise directions of said two interconnections; and
a second group of upper via plugs interposed between the upper interconnection and said set of two interconnections, the upper via plugs of the second group being spaced from one another in the lengthwise directions of said two interconnections, and
wherein the first and the second groups of the upper via plugs are spaced from one another in the widthwise direction of said two interconnections, and
the first and the second groups of upper via plugs are offset from one another in the lengthwise directions of said two interconnections.

10. The image sensor of claim 9, wherein the upper interconnection covers the optical black region.

11. The image sensor of claim 9, wherein the dummy signal patterns are disposed in the light receiving region, and further comprising a sub-pattern extending from the upper interconnection over the dummy signal patterns.

12. The image sensor of claim 11, wherein the sub-pattern is constituted by a metal layer.

13. An image sensor comprising:
a substrate;
active pixels occupying a main pixel array region, and dummy pixels occupying a dummy pixel region located along the periphery of the main pixel region, wherein each of the active pixels includes a photo device activated by light incident thereon such that the main pixel region constitutes a light receiving region of the image sensor, and the dummy pixels generate a signal corresponding to optical black;
peripheral circuitry comprising MOS transistors occupying a peripheral circuit region, wherein the dummy pixel region and the peripheral circuit region constitute an optical black region of the image sensor, and the light receiving region and the optical black region have an interface a length of which extends across the substrate in the direction of a first axis;
signal lines electrically connecting the peripheral circuitry to the active pixels;
at least one interconnection disposed on the substrate extending along the interface between the light receiving region and the optical black region; and
at least one set of opaque light shielding members interposed between the interconnection and the semiconductor substrate, wherein the light shielding members of each said set are disposed at the same level in the sensor and adjacent the interface, and the light shielding members of each said set are arranged in a zigzag extending along the interface.

14. The image sensor of claim 13, wherein respective ones of the light shielding members have opposite ends that are juxtaposed, in the direction of a second axis perpendicular to the first axis, with two other light shielding members, respectively.

15. The image sensor of claim 13, wherein the at least one interconnection comprises a layer of metal that covers the optical black region.

16. The image sensor of claim 13, wherein the at least one interconnection comprises an upper interconnection, and a set of two intermediate interconnections interposed between the upper interconnection and the semiconductor substrate, each of the intermediate interconnections extending longitudinally along the interface between the light receiving region and the optical black region such that the set of intermediate connections has a first side facing the light receiving region and a second side facing the optical black region, and the intermediate interconnections being spaced horizontally from each other along the interface, the at least one set of opaque light shielding members comprises a first set of opaque light shielding members interposed between the set of intermediate interconnections and the substrate as disposed in contact with the intermediate interconnections, and a second set of opaque light shielding members interposed between the upper interconnection and the set of two intermediate interconnections as disposed in contact with the upper interconnection and the intermediate interconnections, and the signal lines comprise at least one signal line extending between the intermediate interconnections from the light receiving region toward the optical black region.

17. The image sensor of claim 15, wherein the at least one signal line comprises two signal lines disposed at the same level as the intermediate interconnections such that each of the two signal lines is disposed closer than the other to a respective one of the intermediate interconnections and is spaced a predetermined distance, in the direction of the first axis, from the respective intermediate interconnection, whereby a gap is defined between each of the two signal lines and the respective intermediate connection closest thereto, and further comprising:

a first dummy pattern extending from one of the two signal lines in the direction of the first axis and facing the gap between said one of the two signal lines and the respective intermediate connection closest thereto, and a second dummy pattern extending from the other of the two signal lines in the direction of the first axis and facing the gap between said other of the two signal lines and the respective intermediate connection closest thereto.

18. The image sensor of claim 16, wherein the at least one signal line is a single signal line whereby gaps are defined between the single signal line and the intermediate connections between which the single signal line extends, and further comprising:

a first dummy pattern extending from one side of the single signal line in the direction of the first axis and facing one of the gaps, and a second dummy pattern extending from the other side of the single signal line in the direction of the first axis and facing the other of the gaps.

19. The image sensor of claim 16, further comprising:

dummy signal patterns disposed in the light receiving region, the dummy patterns extending in opposite directions from opposite sides of said at least one signal line, respectively, each of the dummy signal patterns disposed adjacent one of the first and second sides of the set of intermediate interconnections; and a sub-pattern extending from the upper interconnection over the dummy signal patterns.

* * * * *